United States Patent
Ono et al.

(10) Patent No.: US 7,320,731 B2
(45) Date of Patent: *Jan. 22, 2008

(54) PROCESS FOR GROWING SILICON SINGLE CRYSTAL AND PROCESS FOR PRODUCING SILICON WAFER

(75) Inventors: Toshiaki Ono, Tokyo (JP); Wataru Sugimura, Tokyo (JP); Masataka Hourai, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/488,408

(22) Filed: Jul. 17, 2006

(65) Prior Publication Data
US 2007/0017436 A1    Jan. 25, 2007

(30) Foreign Application Priority Data
Jul. 19, 2005    (JP)    ............................. P2005-208525

(51) Int. Cl.
*C30B 15/20* (2006.01)
(52) U.S. Cl. ............................. 117/20; 117/13; 117/19
(58) Field of Classification Search ................. 117/13, 117/19, 20
See application file for complete search history.

(56) References Cited

U.S. PATENT DOCUMENTS

| | | | |
|---|---|---|---|
| 5,954,873 A * | 9/1999 | Hourai et al. | .................. 117/13 |
| 6,245,430 B1 * | 6/2001 | Hourai et al. | ............... 428/450 |
| 6,569,237 B2 | 5/2003 | Tanaka et al. | |
| 6,843,847 B1 | 1/2005 | Iida et al. | |
| 2006/0156969 A1 | 7/2006 | Hourai et al. | |

* cited by examiner

*Primary Examiner*—Felisa Hiteshew
(74) *Attorney, Agent, or Firm*—Kolisch Hartwell, P.C.

(57) ABSTRACT

A process for growing a silicon single crystal which is capable of growing a silicon single crystal at a pulling rate which is not lower than the critical pulling rate at which an OSF-generating region will be generated is provided. Such a process for growing a silicon single crystal is characterized by using an atmospheric gas for growing a single crystal which is a hydrogen-containing gas which contains a hydrogen-containing substance, and pulling the silicon single crystal at a pulling rate ranging from a value with which the ratio (a/b) of the diameter (b) of the silicon single crystal and the outer diameter (a) of a ring which consists of the OSF-generating region in the radial direction of the silicon single crystal is not higher than 0.77 to another value with which the OSF-generating region disappears at the center part of the crystal.

8 Claims, 5 Drawing Sheets

PROCESS FOR GROWING SILICON SINGLE CRYSTAL AND PROCESS FOR PRODUCING SILICON WAFER

BACKGROUND OF THE INVENTION

1. Field of the Invention

The present invention relates to a process for growing silicon single crystal and a process for producing a silicon wafer, in particularly, to a process for growing silicon single crystal which is capable of pulling it up at a pulling rate at which a silicon single crystal including a laser scattering tomography defect-generating region is grown, without generating a hydrogen defect.

Priority is claimed on Japanese Patent Application No. 20005-208525, filed Jul. 19, 2005, the content of which is incorporated herein by reference.

2. Description of the Related Art

As a production method for a silicon single crystal which is a material of a silicon wafer, a growing method by the Czochralski method (referred to as "CZ method" hereinafter) is known.

It is known that minute defects will be formed during the production process of a device, i.e. a grown-in defect is generated in the silicon single crystal produced by the CZ method. FIG. 1 is a cross-sectional view for explaining the distribution state of defects in a radial direction of the silicon single crystal obtained by the CZ method. As shown in FIG. 1, the grown-in defect of the silicon single crystal obtained by the CZ method consists of hole defect having a diameter of approximately 0.1 to 0.2 μm, which is called a laser scattering tomography defect or COP (crystal-originated particle), etc. and a minute dislocation having a diameter of approximately 10 μm, which is called a dislocation cluster.

Moreover, as for the silicon single crystal shown in FIG. 1, an oxygen-induced stacking defect (referred to as "OSF" hereinafter) has appeared in the shape of a ring at the region of approximately ⅔ of the outer diameter. At the inner portion of the OSF-generating region where the OSF will be generated, there is a region (a laser scattering tomography defect-generating region) where approximately $10^5$ to $10^7/cm^3$ of a laser scattering tomography defect is detected, whereas at the outer portion there is a region (a dislocation cluster-generating region) where approximately $10^3$ to $10^4/cm^3$ of a laser scattering tomography defect is present.

FIG. 2 is a figure for explaining the distribution state of defects of the cross-section of a silicon single crystal which is produced by reducing gradually the pulling rate at the time of pulling during growth. It should be noted that FIG. 1 is a sectional view of the silicon single crystal grown at the pulling rate corresponding to the position of A shown in FIG. 2.

As shown in FIG. 2, at the stage where the pulling rate is high, a ring-like OSF-generating region appears in a crystal circumference part, and the inner portion of the OSF-generating region serves as a laser scattering tomography defect-generating region where many laser scattering tomography defect will be generated. And the diameter of the OSF-generating region decreases gradually and the dislocation cluster-generating region where dislocation clusters will be generated appears at the outer portion of the OSF-generating region, and then the OSF-generating region disappears and the dislocation cluster region will appear in the whole surface.

Moreover, an oxygen precipitation-promoted region (PV region) where an oxygen precipitate (BMD: Bulk Micro Defect) can be formed exists on the outside which is adjacent to a ring-like OSF-generating region, and there is an oxygen precipitation-inhibited region (PI region), where no oxygen precipitate is generated, between the oxygen precipitation-promoted region and the dislocation cluster-generating region.

The silicon single crystal in which a laser scattering tomography defect is detected has a negative influence which is smaller than that of a silicon single crystal from which a dislocation cluster is detected, and excels in productivity because it is possible to increase the pulling rate. However, as integrated circuits have been down-sized in recent years, deterioration of gate oxide integrity due to a laser scattering tomography defect has been pointed out.

Moreover, as a hot-zone structure in the case of growing a silicon single crystal by the CZ method, for example, a hot-zone structure in which the temperature gradient (Gc) at a central portion of the crystal is the same as or greater than the temperature gradient (Ge) at a perimeter of the crystal (Gc≧Ge) has been proposed in, for example, Patent document 1.

FIG. 3 is a drawing for explaining the distribution state of defects of a cross-section of a silicon single crystal which is grown while gradually decreasing the pulling rate at the time of pulling, with a growing apparatus having a hot-zone structure in which the temperature gradient (Gc) at a central portion of the crystal is the same as or greater than the temperature gradient (Ge) at a perimeter of the crystal (Gc≧Ge).

As shown in FIG. 3, if it grows at a pulling rate ranging from B to C shown in FIG. 3, with a growing apparatus which has the hot-zone structure in which the formula of (Gc≧Ge) is satisfied, then the temperature gradient G on the side of a crystal at near the solid-liquid interface will be controlled, so that a silicon single crystal which serves as a uniform defect-free region over the whole wafer surface is obtained.

Furthermore, in Patent document 1, a technology for increasing the pulling rate margin of a defect-free crystal by adding hydrogen to a pulling furnace using a growing apparatus having a hot-zone structure in which the formula of (Gc≧Ge) is satisfied has been proposed. FIG. 4 is a drawing for explaining the distribution state of defects of a cross-section of a silicon single crystal which is grown while decreasing gradually the pulling rate at the time of pulling, and supplying an inert gas in which hydrogen is added to the pulling furnace, using a growing apparatus having the same hot-zone structure as in FIG. 3 in which the formula of (Gc≧Ge) is satisfied.

If, as an atmospheric gas for growing a single crystal, a mixed gas consisting of an inert gas and hydrogen is used, then the pulling rate at which an OSF-generating region disappears in the central part of a crystal will increase. Therefore, as shown in FIG. 4, it is possible to make a critical rate of a range of pulling rate (the range of B to C in FIG. 3, and the range of D to E in FIG. 4) at which a defect-free crystal can be pulled up higher than that of the example shown in FIG. 3 in which no hydrogen gas is added to the pulling furnace.

[Patent Document 1] International publication WO 2004/ No. 083496 pamphlet

In the technology disclosed in Patent document 1, it is possible to suppress the generation of COP, which is a laser scattering tomography defect, by adding hydrogen into the pulling furnace, without decreasing the pulling rate to be not higher than the critical pulling rate at which an OSF-generating region will be generated, however, in the case of growing a silicon single crystal at a pulling rate which is not lower than the critical pulling rate at which an OSF-generating region will be generated, a large cavity consisting of a hydrogen defect will be generated, which has been a problem. The hydrogen defect will not disappear even if it is subjected to a heat treatment, and hence it is impossible to use a silicon single crystal in which hydrogen defects exist as a silicon wafer for use in a semiconductor.

The present invention is made in view of the above circumstances. That is, it is an object of the present invention to provide a process for growing a silicon single crystal which is capable of growing a silicon single crystal at a pulling rate which is not lower than the critical pulling rate at which an OSF-generating region will be generated even if an atmospheric gas for growing a single crystal contains a gaseous hydrogen-containing substance, and of growing a silicon single crystal which contains an OSF-generating region and no hydrogen defects.

Moreover, it is another object of the present invention to provide a process for producing a hydrogen defect-free silicon wafer which is extracted from a straight trunk portion of a silicon single crystal which has been grown by the process for growing a silicon single crystal in the above.

SUMMARY OF THE INVENTION

In order to solve the above problem, the present invention provides a process for growing a silicon single crystal by the CZ method characterized by using an atmospheric gas for growing a single crystal which is a hydrogen-containing gas which contains a hydrogen-containing substance, and pulling said silicon single crystal at a pulling rate ranging from a value with which the ratio (a/b) of the diameter (b) of said silicon single crystal and the outer diameter (a) of a ring which consists of an OSF-generating region in the radial direction of said silicon single crystal is not higher than 0.77 to another value with which said OSF-generating region disappears at the center part of the crystal.

Moreover, in the process for growing a silicon single crystal as set forth in the above, the hydrogen-containing substance in the hydrogen-containing gas may have a concentration ranging from 40 to 400 Pa in terms of a hydrogen gas reduced partial pressure.

Moreover, in the process for growing a silicon single crystal as set forth in the above, the silicon single crystal may be grown using a hot-zone structure in which the temperature gradient (Gc) at the center part of the crystal is equivalent to or higher than (Gc≧Ge) the temperature gradient (Ge) at the circumferential part of the crystal.

Moreover, in the process for growing a silicon single crystal as set forth in the above, the hydrogen-containing substance may be hydrogen gas.

Moreover, in the process for growing a silicon single crystal as set forth in the above, the oxygen concentration may be not more than $12 \times 10^{17}$ atoms/cm$^3$ (ASTM F121-1979).

Moreover, in the process for growing a silicon single crystal as set forth in the above, the silicon single crystal which is pulled up may have a defect-free region outside the ring.

Moreover, in order to solve the above problem, the present invention provides a process for producing a silicon wafer characterized by performing a defect-free layer forming heat treatment on a silicon wafer extracted from a straight trunk part of a silicon single crystal which is grown by any one of the process for growing a silicon single crystal as set forth in the above.

Moreover, in order to solve the above problem, the present invention provides the process for producing a silicon wafer characterized by growing an epitaxial layer onto the surface of the silicon wafer extracted from a straight trunk part of a silicon single crystal which is grown by any one of the process for growing a silicon single crystal as set forth in the above.

The inventors of the present invention have thoroughly researched and found that, as described later, it is possible to suppress the generation of hydrogen defects by using an atmospheric gas for growing a single crystal which is a hydrogen-containing gas which contains a hydrogen-containing substance having a concentration ranging from 40 to 400 Pa in terms of a hydrogen gas reduced partial pressure, and pulling the silicon single crystal at a pulling rate ranging from a value with which the ratio (a/b) of the diameter (b) of the silicon single crystal and the outer diameter (a) of a ring which consists of an OSF-generating region in the radial direction of the silicon single crystal is not higher than 0.77 to another value with which said OSF-generating region disappears at the center part of the crystal.

In accordance with the present invention, it becomes possible to make a void distribution to be not more than a threshold value of the generation of hydrogen defects in a COP region inside an OSF ring, by making the generating position of an OSF ring to be not more than 0.77 to an outer diameter of a silicon single crystal, and hence it is possible to grow a silicon single crystal which contains an OSF-generating region and no hydrogen defects, even if an atmospheric gas for growing a single crystal contains a gaseous hydrogen-containing substance.

Here, as shown in FIGS. 7 to 9, in the COP region inside an OSF ring, it is thought that voids are distributed such that the number of voids is the highest at the center axis position of a crystal, gradually decreasing along the circumferencial direction of crystal to be the lowest immediately inside the OSF ring.

This void distribution state does not depend on the change of position of the OSF ring in the direction of crystal diameter, and holds the state such that the number of voids is the highest at the center axis position of a crystal, gradually decreasing along the circumferencial direction of crystal to be the lowest immediately inside the OSF ring. Moreover, as shown in FIGS. 7 to 9, the void concentration in the radial position corresponding to the OSF ring does not depend on the radial position on which the OSF ring is generated, and becomes a predetermined value which is determined by the pulling atmosphere, etc. Therefore, as the radial position of an OSF ring changes from an outer position to an inner position, as shown in FIGS. 7, 9, and 8, respectively, the void distribution at the center position of a crystal will decrease.

Moreover, although a void is formed from condensed hydrogen defects, its formation has a certain threshold, and it is thought that a void will not be formed in the case where the void density is less than a predetermined density. For this reason, when an OSF ring exists outside in the radial direction of a crystal, as shown in FIG. 7, the void density in the COP region inside an OSF ring is high, and a possibility that a hydrogen defect-generating threshold value will be exceeded and a hydrogen defect will occur is high. Whereas, when an OSF ring exists inside in the radial direction of a crystal, as shown in FIG. 8, the void density in the COP region inside an OSF ring is low, and a possibility that a hydrogen defect-generating threshold value will not be exceeded and a hydrogen defect will occur is very low.

In view of these circumstances, the inventors of the present invention have found that if an OSF ring exists on a radial position where the ratio to an outer diameter in a radial direction of a crystal becomes approximately ¾, more precisely not more than 0.77, then the void density in a COP region inside the OSF ring is low, so that it will not exceed a hydrogen defect-generating threshold value, and as a result the possibility that hydrogen defects will be generated is very low.

Therefore, it becomes possible to lift up a silicon single crystal which is capable of suppressing the void density low in the COP region inside the OSF ring so as not to exceed the hydrogen defect generating threshold value thereby preventing generation of hydrogen defects, by setting a V/G value such that an OSF ring will exist inside a radial position where the ratio to an outer diameter in a radial direction of a crystal becomes approximately ¾, more precisely not more than 0.77.

At the same time, as shown in FIG. 5, by pulling it up in a hydrogen-containing atmosphere, it is also possible to reduce the width size (width size in the radial direction of a ring) of an OSF ring compared to the case of pulling it up in an atmosphere with no hydrogen, thereby reducing the influence due to OSF.

Moreover, in accordance with the present invention, even if the atmospheric gas for growing a single crystal contains a gaseous hydrogen-containing substance, a silicon single crystal can be pulled up at a pulling rate higher than the critical pulling rate at which an OSF-generating region will be generated, thereby it can be grown at a faster pulling rate than usual.

Therefore, since it becomes possible to lift up a hydrogen defect-free single crystal in which the influence of an OSF ring is reduced at a high rate, it becomes possible to shorten the time for producing a silicon single crystal and a silicon wafer, thereby reducing the production cost, as a result.

Moreover, in accordance with the present invention, as described later, the effect of reducing the average size of COP can be sufficiently obtained. Therefore, it is possible to obtain a silicon wafer with no defects and excellent gate oxide integrity by performing a defect-free layer forming heat treatment on a silicon wafer which is extracted from the grown silicon single crystal. In addition, in accordance with the present invention, it is possible to operate safely without burning, even if air leaks and flows into a growing apparatus of a silicon single crystal.

Moreover, in accordance with the present invention, as described later, it is possible to grow a silicon single crystal which causes no negative influence on a device due to dislocation clusters, without making a cluster region be included in the silicon single crystal which is to be grown.

An explanation about the principle of the present invention will be given below.

In an apparatus for growing, hydrogen in an amount corresponding to a partial pressure of hydrogen contained in an inert gas atmosphere is distributed into a silicon crystal which will be dissolved into a silicon melt to be solidified.

The hydrogen concentration in a silicon melt is determined by Henry's law based on the hydrogen partial pressure in a gaseous phase, and is expressed as follows:

$$P_{H2}=kC_{LH2}$$

Here, $P_{H2}$ is the hydrogen partial pressure in the atmosphere, $C_{LH2}$ is the hydrogen concentration in a silicon melt, and k is the coefficient therebetween.

On the other hand, the concentration in a silicon single crystal is determined by the relationship between the concentration in a silicon melt and segregation, and is expressed as $$C_{SH2}=k'C_{LH2}=(k'/k)\,P_{H2}.$$

Here, $C_{SH2}$ is the hydrogen concentration in a crystal, and k' is the segregation coefficient between the silicon melt and crystal of hydrogen.

As mentioned above, in the case of growing it in an inert gas atmosphere which contains hydrogen, the hydrogen concentration in the silicon single crystal immediately after solidification can be controlled constantly in the direction of an axis of a crystal at a desired concentration, by controlling the hydrogen partial pressure in the atmosphere.

This hydrogen partial pressure is controllable by hydrogen concentration and furnace pressure.

It should be noted that most of the hydrogen which affects the formation of a grown-in defect will be dispersed outside the silicon single crystal during the successive cooling step.

The inventors of the present invention have conducted the experiment shown below in order to investigate the relationship between the hydrogen molecule partial pressure of the gas of a hydrogen atom-containing substance and COP in an atmospheric gas.

EXPERIMENTAL EXAMPLES 1 TO 5

That is, a silicon single crystal having a ring consisting of an OSF-generating region at the outer periphery thereof was grown, while using a growing apparatus equipped with a hot zone structure which satisfies the formula (Gc≧Ge) similarly to FIG. 3, and supplying an inert gas in which hydrogen was added into a pulling furnace so as to possess the same hydrogen molecular partial pressure as in Experimental Examples 1 to 5 shown in Table 1, and then a silicon wafer was extracted from the resultant silicon single crystal and an average size of COP and the density were obtained therefrom.

TABLE 1

| Experimental Example | $H_2$ Partial Pressure (Pa) | Defect Average Size (μm) | Defect Density (/cm²) |
| --- | --- | --- | --- |
| 1 | Non-doping | 0.198 | 19.45 |
| 2 | 30 | 0.187 | 24.03 |
| 3 | 40 | 0.105 | 65.24 |
| 4 | 240 | 0.083 | 83.66 |
| 5 | 400 | 0.071 | 92.31 |

It should be noted that the average size of COP shown in Table 1 was obtained by comparing the COP volume, using a defect evaluating apparatus through an infrared interfering method {OPP (Optical Precipitate Profiler): produced by High Yield Technology Co., Ltd.}.

Moreover, the density of COP was calculated based on the number of COP measured using a surface part defect measuring apparatus (MO601: produced by Mitsui Mining and Smelting Co., Ltd.) by light scattering.

As shown in Table 1, as the hydrogen molecular partial pressure increases, the density of COP increases and the average size of COP is reduced.

If the hydrogen molecular partial pressure is less than 40 Pa, then the average size of COP exceeds 0.11 μm, so that the effect of reducing the average size of COP cannot be sufficiently obtained, and hence it is not preferable.

If the average size of COP is not less than 0.11 μm, it may be impossible to obtain a defect-free silicon wafer even if a defect-free layer-forming heat treatment is performed on a silicon wafer which is extracted from a grown silicon single crystal, and as a result, there is a possibility that excellent gate oxide integrity property cannot be obtained.

Moreover, it becomes possible to operate safely the apparatus for growing a silicon single crystal without burning, even if air leaks and flows into the apparatus for growing a silicon single crystal, by setting the hydrogen molecular partial pressure of the gaseous hydrogen atom-containing substance in the atmospheric gas to be not more than 400 Pa.

Moreover, in accordance with the present invention, it is possible to adjust the pulling rate margin of only each region among the pulling rate margins of a defect-free crystal, by using a mixed gas of an inert gas and a gaseous hydrogen atom-containing substance to adjust the partial pressure of hydrogen contained in the atmospheric gas.

FIG. 5 is a graph which shows the relationship between the hydrogen partial pressure in the atmosphere and V/G. Since the temperature distribution inside the single crystal under pulling hardly changes even if the pulling rate changes, as long as the hot zone structure is the same, the V/G shown in FIG. 5 is regarded as a pulling rate. As shown in FIG. 5, as the hydrogen partial pressure in an atmosphere increases, the pulling rate at which a defect-free crystal is obtained decreases, whereas the pulling rate margin of a defect-free crystal increases.

Moreover, the pulling rate margin of the OSF region is reduced as the hydrogen partial pressure increases. The pulling rate margin of a PI region is increased extremely as the hydrogen partial pressure increases. Moreover, although the pulling rate margin of a PV region increases or decreases as the hydrogen partial pressure increases, the pulling rate margin increases when the hydrogen partial pressure ranges from 100 to 250 Pa.

As shown in FIG. 5, in the process for growing a silicon single crystal in accordance with the present invention, the pulling rate margin of a defect-free crystal can be effectively increased by setting the hydrogen molecular partial pressure of the gaseous hydrogen atom-containing substance in an atmospheric gas to be from 40 to 400 Pa. For this reason, it can be easily produced in parts so that a dislocation cluster-generating region may not be included in a silicon single crystal which includes the OSF-generating region grown-in the present invention.

It should be noted that if the hydrogen molecular partial pressure is set to be less than 40 Pa, then the effect of increasing the pulling rate margin of a defect-free crystal is not fully obtained, and hence it is not preferable. Moreover, by setting the hydrogen molecular partial pressure of the gaseous hydrogen atom-containing substance in an atmospheric gas to be not more than 400 Pa, it is possible to operate safely without burning, even if air leaks and flows into the apparatus for growing a silicon single crystal.

Moreover, in accordance with the present invention, a silicon single crystal having a defect-free region as a region outside a ring which consists of an OSF-generating region is grown, through a method for growing a silicon single crystal using a hot-zone structure in which the temperature gradient (Gc) in the crystal central part is the same as or greater than (Gc≧Ge) the temperature gradient (Ge) in a crystal perimeter part.

Namely, as shown in FIG. 4, in the case of pulling up a silicon single crystal at a pulling rate within a range (range from F to G in FIG. 3) which ranges from a value (the mark F in FIG. 4) at which the ratio (a/b) of the outer diameter (a) of the ring which consists of an OSF-generating region in the radial direction of the above silicon single crystal and the diameter (b) of the above silicon single crystal is not more than 0.77 to a value (the mark G in FIG. 4) at which an OSF-generating region disappears at the center part of the crystal, using a hot-zone structure in which the temperature gradient (Gc) in the crystal central part is the same as or greater than (Gc≧Ge) the temperature gradient (Ge) in a crystal perimeter part, the region outside the ring which consists of the OSF-generating region becomes the PV region and the PI region. Therefore, no dislocation cluster-generating region is included in the silicon single crystal grown-in accordance with the present invention, and hence an excellent silicon single crystal can be grown without imparting negative influence to devices due to the dislocation cluster.

Moreover, in the present invention, since a silicon single crystal including an OSF-generating region is grown, if the oxygen concentration exceeds $12 \times 10^{17}$ atoms/cm$^3$ (ASTM F 121-1979), then there is a possibility that an OSF is formed based on the conditions of a device process to deteriorate performance in the silicon wafer extracted from the obtained silicon single crystal. For this reason, in the process for growing a silicon single crystal in accordance with the present invention, the oxygen concentration is preferably not more than $12 \times 10^{17}$ atoms/cm$^3$ (ASTM F 121-1979).

It should be noted that the oxygen concentration can be adjusted by controlling the number of rotations of a crucible, furnace pressure, a heater, etc.

Moreover, in accordance with the present invention, a silicon single crystal including an OSF-generating region and having an average size of COP of less than 0.11 micrometers is grown. Therefore, by performing for example a defect-free layer forming heat treatment to perform heat treatment at a temperature ranging from 1100° C. to 1300° C. for 24 hours in a non-oxidizing atmosphere, it is easy to make a region where a device is formed on the surface of a silicon wafer, i.e. an activated region, defect-free, thereby forming a silicon wafer having a defect-free layer in which no COP and no OSF exist on the surface part thereof.

If the heat treatment temperature is lower than 1100° C., then a device-activated region may not become completely defect-free. As a non-oxidizing atmospheric gas, Ar, $H_2$, $N_2$, or a mixed gas thereof is exemplary.

Moreover, since the silicon wafer extracted from the silicon single crystal which is grown-in accordance with the present invention is a silicon wafer which includes an OSF-generating region, an oxygen precipitate will be formed at the device-activated region on the surface of a wafer, depending on the conditions for the heat treatment which is performed during a device process, and hence there is a possibility of deteriorating the device performance. Although, if the above defect-free layer forming heat treatment is performed, then it is possible to form a DZ layer (denuded zone) in which no oxygen precipitate nucleus etc. exists on the wafer surface through the oxygen outward diffusion action, for example, by performing an RTA (rapid thermal annealing) processing to perform a heat treatment for not less than 0 seconds at a temperature ranging from 1100° C. to 1350° C. in an Ar or He atmosphere, or Ar or He which contains a $NH_3$ atmosphere to a wafer, it is possible to form a DZ layer in which an oxygen precipitate nucleus at a wafer surface part is eliminated easily in a short time.

It should be noted that in the silicon wafer extracted from the silicon single crystal which is grown-in accordance with the present invention, as for a heat treatment such as donor killer, DZ, IG etc., one or more heat treatment selected from those conducted in an oxidizing atmosphere, in a non-oxidizing atmosphere, in an inert gas, in a reductive atmosphere, RTA, in series, a batch type, etc., can be combined with each other, corresponding to the performance of the target silicon wafer, and the heat treatment can be performed before, after, or simultaneously with the treatment for forming an epitaxial layer mentioned later.

Moreover, the silicon wafer extracted from the silicon single crystal grown-in accordance with the present invention is also preferable as a substrate for forming an epitaxial layer thereon.

As the process for forming an epitaxial layer, a method which is performed generally can be used, thereby it is possible to obtain an epitaxial silicon wafer with no COP (laser scattering tomography defect) trace, even if it is a thin epitaxial layer having a thickness of not more than approximately 0.5 to 2 μm.

Specifically, it is possible to control the formation of an epitaxial defect of not less than 0.09 μm on the surface of a silicon wafer to be less than 12 pieces/wf, by using $SiHCl_3$ to form an epitaxial layer having a thickness of 0.5 μm at a precipitateing temperature of 1050° C. onto the surface of a silicon wafer having a diameter of 300 mm which is extracted from a silicon single crystal which is grown-in accordance with the present invention.

The silicon wafer of the present invention is suitable as a silicon wafer for use in particle checking.

In the process for growing a silicon single crystal in accordance with the present invention, the hydrogen-containing substance is a substance which contains a hydrogen atom in the molecule and which is thermally decomposed upon being dissolved into a silicon melt to be able to supply a hydrogen atom into the silicon melt. Hydrogen gas itself is contained in this hydrogen-containing substance. The hydrogen concentration in the silicon melt can be increased by mixing this hydrogen-containing substance with an inert gas to be introduced into the atmosphere at the time of growing a silicon single crystal. As the hydrogen-containing substance, hydrogen atom-containing inorganic compounds such as hydrogen gas, $H_2O$, HCl, etc., hydrocarbons such as silane gas, $CH_4$, $C_2H_2$, etc., and hydrogen atom-containing organic compounds such as an alcohol, a carboxylic acid are exemplary, in particular, hydrogen gas is preferable. Moreover, as an inert gas, a low-cost Ar gas is preferable, in addition, and various rare gas single substances or a mixed gas thereof, such as He, Ne, Kr, and Xe, can be used. As a hydrogen-containing substance, one or more gases selected therefrom can be used.

Moreover, in the present invention, the concentration of hydrogen-containing substance in a hydrogen-containing atmosphere is determined as the above range expressed in terms of the hydrogen gas reduced partial pressure. Here, it is expressed in terms of the hydrogen gas reduced partial pressure, because the quantity of the hydrogen atoms derived from thermal decomposition of the hydrogen-containing substance is influenced by the quantity of the hydrogen atoms originally contained in the hydrogen-containing substance etc. For example, although one mole of $H_2$ is contained in one mol of $H_2O$, only 0.5 mol of $H_2$ is contained in one mol of HCl.

Therefore, in the present invention, it is preferable to determine the concentration of a hydrogen-containing substance, while standardizing the hydrogen-containing atmosphere in which hydrogen gas is introduced into an inert gas at the above partial pressure, such that the same atmosphere as in the standardized atmosphere can be obtained, and the preferable partial pressure of the hydrogen-containing substance at that time is specified as a hydrogen gas reduced partial pressure.

Namely, in the present invention, it is necessary to adjust the added amount of the hydrogen-containing substance, so that the hydrogen gas converted partial pressure in the atmosphere after conversion should be the above range, on the assumption that the hydrogen-containing substance dissolves in a silicon melt to be thermally decomposed in a hot silicon melt and converted into a hydrogen atom.

It should be noted that in the case of using hydrogen gas as a gaseous hydrogen atom-containing substance, it is possible to supply hydrogen gas into the pulling furnace through piping for exclusive use from a commercially available hydrogen gas cylinder, a hydrogen gas storage tank, a hydrogen tank in which hydrogen gas is absorbed with a hydrogen storing metal alloy, etc.

It should be noted that in the case that oxygen gas ($O_2$) exists in an inactive atmosphere, it can exist at a concentration in which a difference in concentration of not less than 3 volume % between the concentration which is converted with a hydrogen molecule of the gas and twice of concentration of the oxygen gas.

This is because, if the difference in concentration between the concentration which is converted with a hydrogen molecule of the gas and twice of concentration of the oxygen gas is less than 3 volume %, then the effect of controlling the generation of grown-in defects, such as COP and a dislocation cluster due to the hydrogen atom incorporated into a silicon crystal cannot be obtained.

It should be noted that in the present invention, when a furnace internal pressure ranges from 1.3 to 13.3 kPa (10 to 100 Torr), in an atmospheric gas, nitrogen ($N_2$) may exist at a concentration of not more than 20 volume %. If the nitrogen concentration exceeds 20 volume %, then the amount of nitrogen dissolved into a silicon melt increases, the nitrogen concentration in the silicon melt is thickened due to a concentration segregation accompanied with the growth of the silicon single crystal, and at last it reaches a saturated concentration. If the nitrogen concentration reached at the saturated concentration, then a nitride silicon compound is precipitated in the silicon melt, and a silicon single crystal may be dislocated.

DETAILED DESCRIPTION OF THE INVENTION

Hereafter, an explanation of the first embodiment in accordance with the present invention will be given based on drawings.

Figure 1:
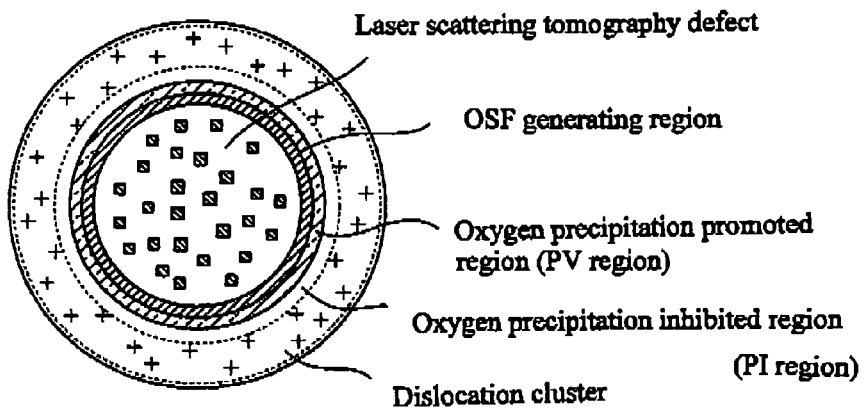
FIG. 1 is a sectional view for explaining the defective distribution state in the radial direction of the silicon single crystal obtained by the CZ method.
Figure 2:
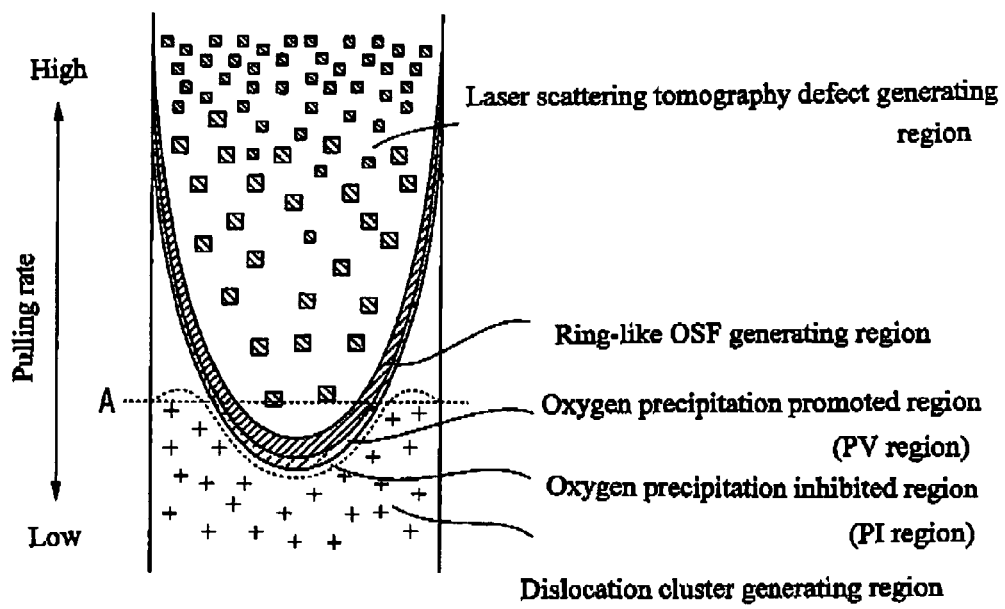
FIG. 2 is a figure for explaining the defective distribution state of the section of a silicon single crystal grown by reducing gradually the pulling rate upon being pulled.
Figure 3:
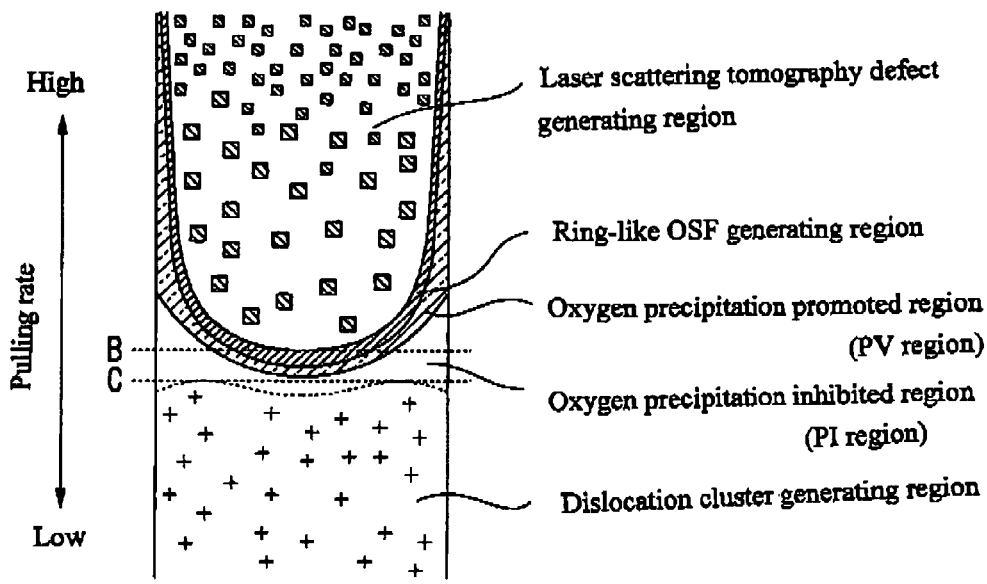
FIG. 3 is a drawing for explaining the distribution state of defects in a cross-section of a silicon single crystal grown while gradually decreasing the pulling rate at the time of pulling, with a growing apparatus having a hot-zone structure in which the temperature gradient (Gc) at a central portion of the crystal is the same as or greater than the temperature gradient (Ge) at a perimeter of the crystal (Gc≧Ge).
Figure 4:
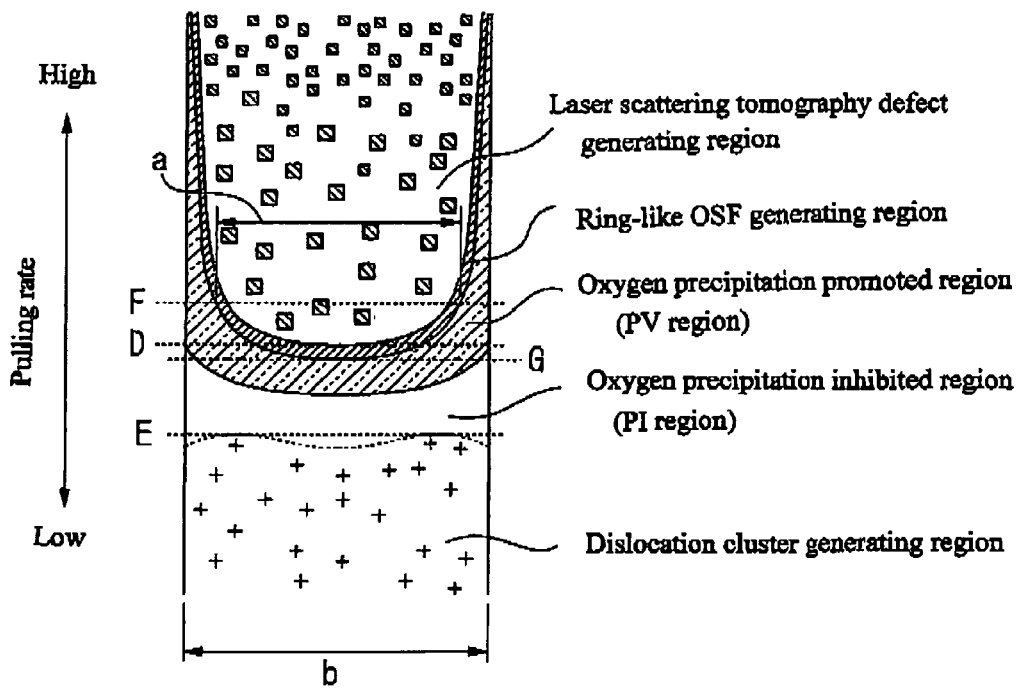
FIG. 4 a drawing for explaining the distribution state of defects in a cross-section of a silicon single crystal which is grown while decreasing gradually the pulling rate at the time of pulling, and supplying an inert gas in which hydrogen is added to the pulling furnace, using a growing apparatus having the same hot-zone structure as in FIG. 3 in which the formula of (Gc≧Ge) is satisfied.
Figure 5:
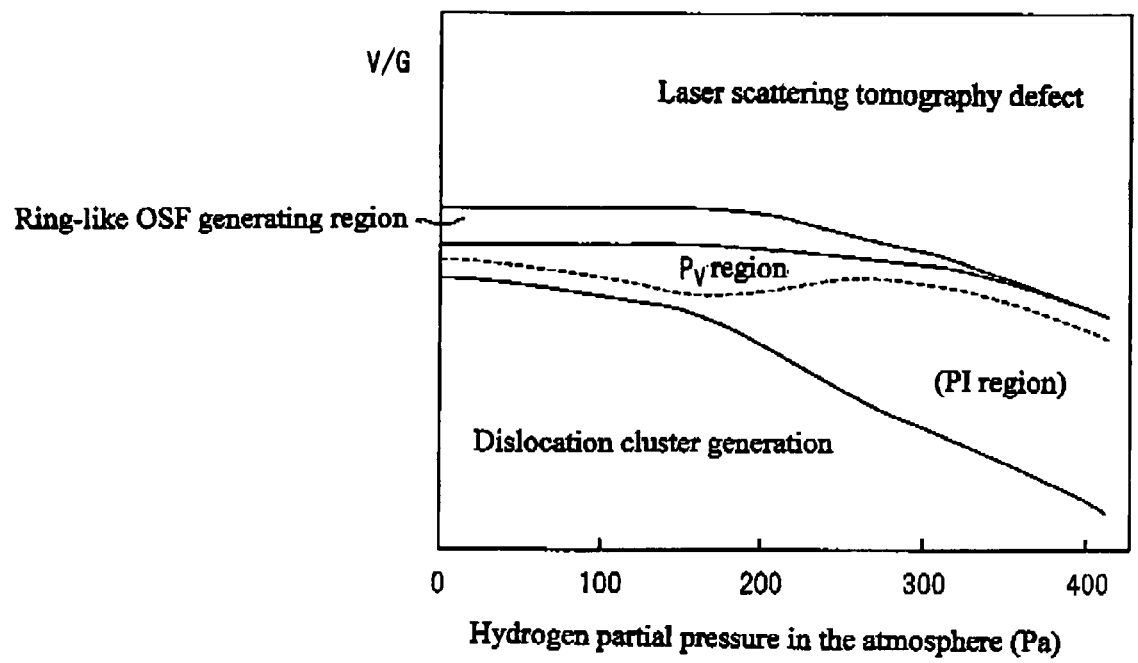
FIG. 5 is a graph which shows the relationship between the hydrogen partial pressure in an atmosphere and V/G.
Figure 6:
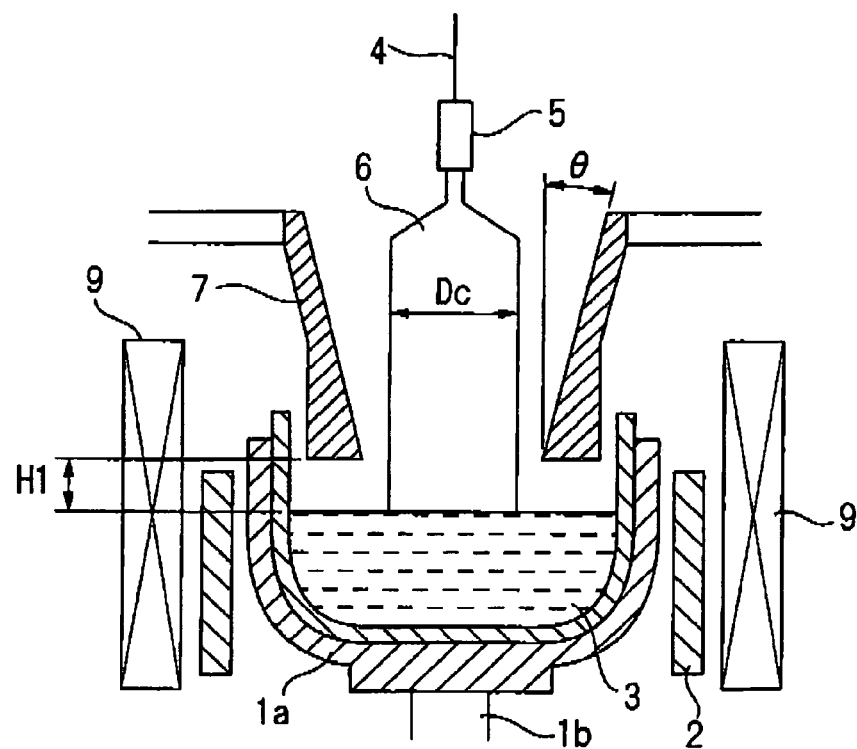
FIG. 6 is a longitudinal cross-section of a CZ furnace suitable for performing the process for growing a silicon single crystal of the present invention.
Figure 7:
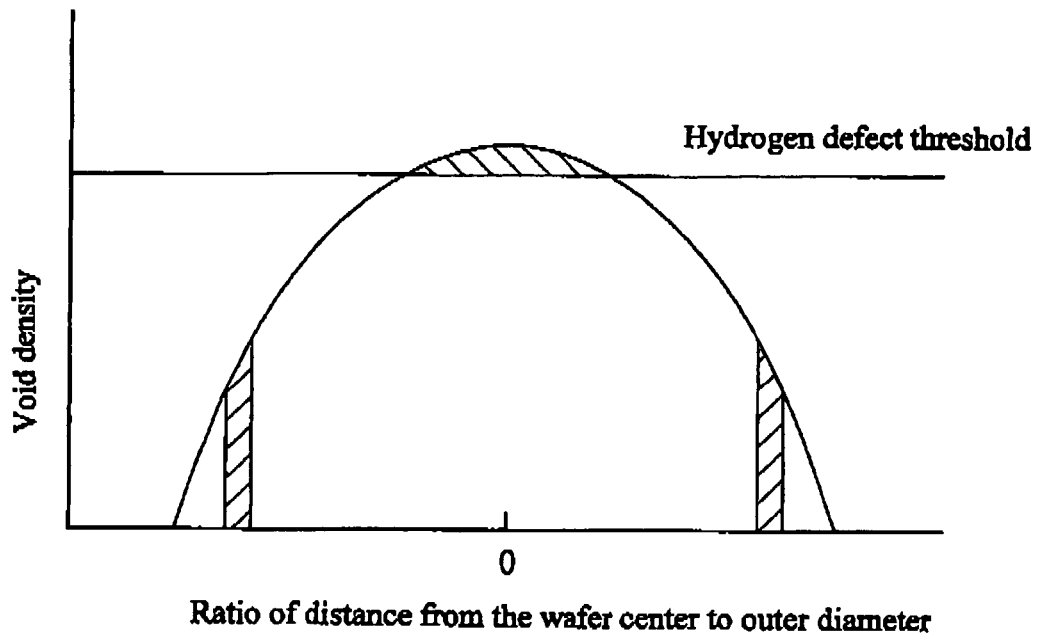
FIG. 7 is a figure graph explaining how the relationship between the OSF ring position and the hole concentration distribution in the radial direction changes to the hydrogen defective generation.
Figure 8:
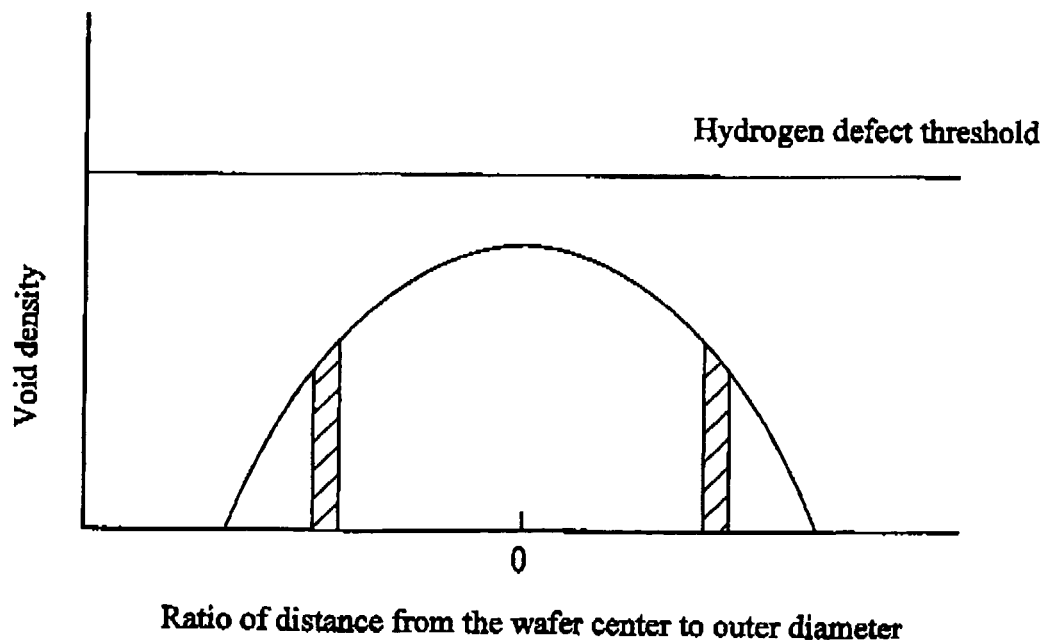
FIG. 8 is a figure graph explaining how the relationship between the OSF ring position and the hole concentration distribution in the direction changes to hydrogen defective generation.
Figure 9:
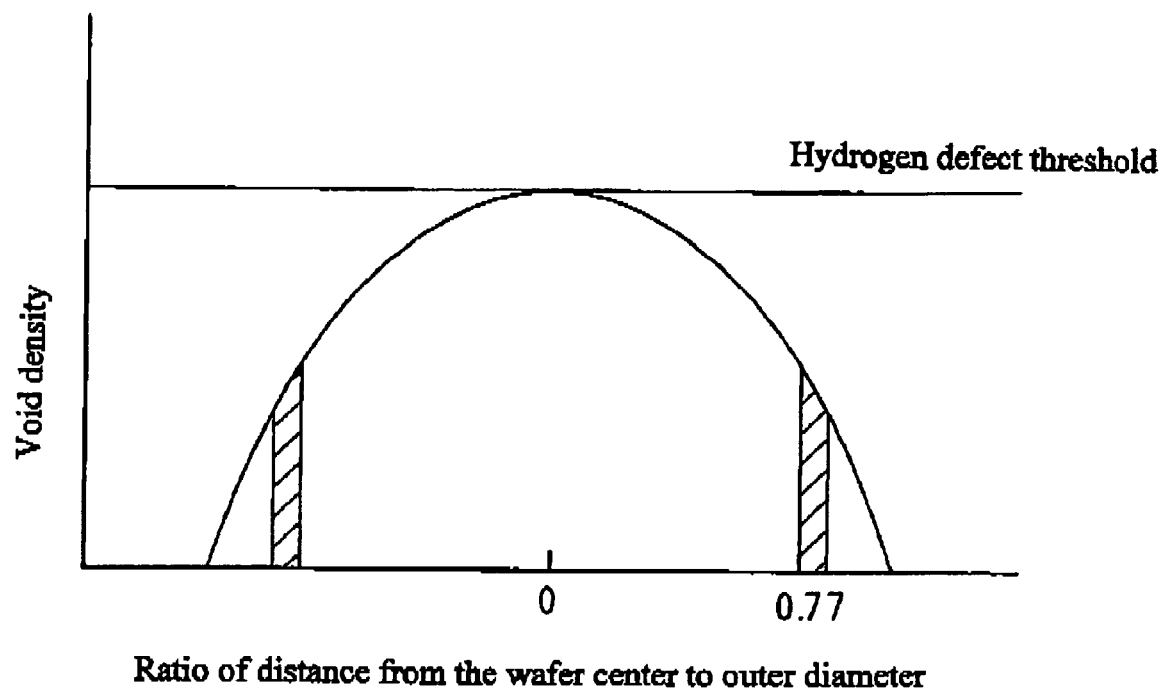
FIG. 9 is a figure graph explaining how the relationship between the OSF ring position and the hole concentration distribution in the direction changes to hydrogen defective generation.

FIG. 6 is a longitudinal cross-section of a CZ furnace suitable for performing the process for growing a silicon single crystal of the present invention.

The CZ furnace shown in FIG. 6 is equipped with a crucible 1 disposed to the central part in a chamber, a heater 2 disposed to the outside of the crucible 1, and a magnetic field feeder 9 disposed to the outside of the heater 2. The crucible 1 has a dual structure which holds a quartz crucible 1a which receives silicon melt 3 inside via an outer graphite crucible 1b, and is rotated and up-and-down driven by a supporting shaft called a pedestal.

A cylindrical heat screen 7 is disposed above the crucible 1. The heat screen 7 has a structure having an outer shell made of graphite, inside of which is filled with a graphite felt. The inner surface of the heat screen 7 is a tapered surface in which the inner diameter is reduced gradually from the upper end to the lower end. The upper external surface of the heat screen 7 is a tapered surface corresponding to the inner surface, and the lower external surface is shaped to form an approximately straight surface so that the thickness of the heat screen 7 may be increased gradually toward a lower part.

This CZ furnace is equipped with a hot-zone structure in which the temperature gradient (Gc) in the crystal central part thereof is the same as or greater than (Gc≧Ge) the temperature gradient (Ge) in a crystal perimeter part.

The heat screen 7 is for isolating the radiant heat from the heater 2 and the surface of the silicon melt 3 to the side surface a silicon single crystal 6 and which surrounds the side surface of the silicon single crystal 6 while being grown as well as the surface of the silicon melt 3.

An example of specification of the heat screen 7 is shown as follows. A radial width W is, for example, 50 mm, an angle of inclination θ of the inner surface which is a reverse truncated cone side to the perpendicular direction is, for example 21°, and a height H1 of the lower end of the heat screen 7 from the surface of the melt is, for example, 60 mm.

It should be noted that a water-cooling means for cooling the side surface part of the silicon single crystal 6 while being grown may be disposed to the inside of the lower end part of the screen 7. As the water-cooling means used here, a spiral aqueduct made of copper etc., and a water-cooled jacket with a water-flowing partition wall made of iron, etc. are exemplary.

Moreover, as for the intensity of the magnetic field supplied from the magnetic field feeder 9, as to a level magnetic field (horizontal magnetic field), it is set so that the intensity of the magnetic field should be within the range of 2000 to 4000 G, more preferably within the range of 2500 to 3500 G, and that the height of the center of the magnetic field from the surface of the melt should be within the range of −150 to +100 mm, more preferably within the range of −75 to +50 mm.

Moreover, as for the intensity of the magnetic field supplied from the magnetic field feeder 9, as to a cusp field (cusp magnetic field), it is set so that the intensity of the magnetic field should be within the range of 200 to 1000 G, more preferably within the range of 300 to 700 G, and that the height of the center of the magnetic field from the surface of the melt should be within the range of −100 to +100 mm, more preferably within the range of −50 to +50 mm.

By supplying a magnetic field from the magnetic field feeder 9 in the above magnetic field center height range and at the intensity of the above magnetic field, it is possible to suppress convection and to make an interface of solid and liquid phases into a desired shape.

Next, an explanation will be given of how to grow a silicon single crystal 6 using the CZ furnace shown in FIG. 6 and the mixed gas consisting of an inert gas and hydrogen gas as atmosphere gas for growing a single crystal.

Setup of an Operational Provision

At first, a silicon single crystal having a target diameter of, for example, 300 mm, is grown under each condition, by setting the mixing ratio so that the hydrogen partial pressure in an atmospheric gas should be, for example, 0, 20, 40, 160, 240, and 400 Pa, in order to provide conditions for operation such as tolerance from the pulling rate at which the ratio (a/b) of the diameter (b) of the silicon single crystal and the outer diameter (a) of a ring which consists of an OSF-generating region in the radial direction of the silicon single crystal is not higher than 0.77 to the pulling rate at which the OSF-generating region disappears at the center part of the crystal.

Namely, a polycrystalline silicon with high purity in an amount of, for example, 300 kg is charged into a crucible, and then a dopant of p-type (B, Al, Ga, etc.) or n-type (P, As, Sb, etc.) is added thereto so that the electrical resistivity of a single crystal should be a desirable value, for example, 10 Ω cm.

The inside of the apparatus is purged with an argon atmosphere at a reduced pressure ranging from 1.33 to 13.3 kPa (10 to 100 torr), and an atmospheric gas is introduced into the apparatus, while adjusting it so that the hydrogen molecular partial pressure in the atmospheric gas should be the above predetermined mixing ratio.

Subsequently, the polycrystalline silicon is heated by the heater 2 to obtain the silicon melt 3, while supplying a horizontal magnetic field with an intensity of, for example, 3000 G, from the magnetic field feeder 9 so that the magnetic field center height should be −75 to +50 mm from the surface of the melt, and a seed crystal which is disposed to a seed chuck 5 is immersed in the silicon melt 3, and the crystal is pulled while rotating the crucible 1 and a pulling shaft 4. At this time, the number of rotations of the crucible, furnace pressure, the heater, etc. are adjusted so as to obtain a desirable oxygen concentration. The crystal orientation is determined as any of {100}, {111} and {110}, and after performing the seeding process for dislocation-free crystals, a shoulder part is formed, and shouldering is performed to form a target body diameter.

At the time of the body length reaches, for example, 300 mm, the pulling rate is adjusted to a value which is sufficiently greater than the critical rate, for example, 1.0 mm/min, and thereafter the pulling rate is reduced approximately linearly corresponding to the pulled length so that the pulling rate should be a value which is smaller than the critical rate, for example, 0.3 mm/min when the body length reaches, for example, 600 mm, and thereafter the body part is grown at this pulling rate until the body length reaches, for example, 1800 mm, and then tail process is performed under normal conditions, and thereafter growing of crystal is finished.

The single crystal thus grown at various hydrogen concentrations is cut longitudinally parallel to the pulling shaft to produce a plate test piece which includes a region around the pulling shaft, and the resultant test piece is subjected to Cu decoration in order to observe the distribution of grown-in defects. First, each test piece is immersed in an aqueous copper sulfate solution and thereafter subjected to air-drying, and then subjected to a heat treatment in a nitrogen atmosphere at 900° C. for approximately 20 minutes. And thereafter, each test piece is immersed in a mixed HF/HNO$_3$ solution in order to remove a Cu silicide layer on the surface layer of the test piece to perform an etching removal of a few tens of micrometers of the surface layer thereof, and thereafter subjected to investigation of the OSF ring position and distribution of each defective region through an X-ray topographic method. Moreover, the density of COP of this sliced test piece is investigated by for example an OPP method, and the density of a dislocation cluster is investigated by for example the Secco etching method.

By the above pulling experiments, the relationship between V/G of each defective region of a laser scattering tomography defective-generating region, an OSF-generating region, PV region, PI region, and a transit cluster-generating region and hydrogen concentration is obtained. Moreover, by changing the pulling rate at various portions several times such as those ranging from 300 mm to 600 mm, ranging from 500 mm to 800 mm, ranging from 700 to 1000 mm, the relationship between the tolerance (pulling rate margin) from the pulling rate at which the ratio (a/b) of the diameter (b) of the silicon single crystal and the outer diameter (a) of a ring which consists of an OSF-generating region in the radial direction of the silicon single crystal is not higher than 0.77 to the pulling rate at which the OSF-generating region disappears at the center part of the crystal and the position in the direction of crystallographic axis can be obtained, and thereby it becomes possible to determine the operational conditions.

(Growing of a Silicon Single Crystal)

Next, the silicon single crystal 6 is grown under suitable operational conditions by the above method, using the CZ furnace shown in FIG. 6, and the mixed gas consisting of an inert gas and hydrogen gas as an atmospheric gas for growing a single crystal.

After a silicon single crystal is grown-in this way, in accordance with a usual processing method, the resultant silicon single crystal will be sliced by a cutting device, such as an ID saw or a wire-saw, and will be processed into a silicon single crystal wafer through processes such as chamfering, wrapping, etching, grinding, etc. It should be noted that there are various processing steps other than these processing steps, such as washing, etc., and these processing steps may be suitably changed corresponding to purpose, such as change of the order of processing steps, and an abbreviation, etc.

It is possible to make an excellent wafer having a device active region which is completely defect-free, by performing a defect-free layer forming heat treatment, for example, at a temperature ranging from 1100° C. to 1300° C. for 1 to 24 hours in a non-oxidizing atmosphere on the wafer thus obtained.

Moreover, although, in the above embodiment, an explanation was given with respect to an example of performing the defect-free layer forming heat treatment on a wafer, an epitaxial layer may be formed on the surface of a wafer, without performing the defect-free layer forming heat treatment in the present invention, or an epitaxial layer may be formed on the surface of a wafer, before performing the defect-free layer forming heat treatment, in the present invention. An epitaxial silicon wafer without COP (laser scattering tomography defect) traces can be obtained, by forming an epitaxial layer on the surface of the wafer thus obtained.

In order to verify the present invention, the experiments shown below were conducted.

EXPERIMENTAL EXAMPLES 6 TO 12

A silicon single crystal with a diameter of 300 mm was grown at a higher pulling rate than that at which the OSF region disappears at the crystal central part, using an apparatus for growing a silicon single crystal having a hot-zone structure in which the temperature gradient (Gc) in the crystal central part was the same as or greater than (Gc≧Ge) the temperature gradient (Ge) in a crystal perimeter part, while supplying an inert gas to which hydrogen was added to the pulling furnace so as to obtain the hydrogen molecular partial pressure in Experimental Examples 6 to 12 shown in Table 2, and then the resultant silicon single crystal was sliced to obtain a silicon wafer.

TABLE 2

| Experimental Example | H$_2$ Partial pressure (Pa) | Position where OSF-ring exists (Wafer diameter ratio) (a/b) | Number of LPD (pieces/wf) | Presence or absence of H$_2$ defect |
|---|---|---|---|---|
| 6 | No doping | 0.48 | 113 | ... |
| 7 | 30 | 0.51 | 87 | None |
| 8 | 40 | 0.73 | 12 | None |
| 9 | 40 | 0.26 | 2 | None |
| 10 | 240 | 0.68 | 4 | Present |
| 11 | 240 | 0.88 | 43 | None |
| 12 | 400 | 0.53 | 3 | None |

With respect to the silicon wafer of Experimental Examples 6 to 12 thus obtained, the ratio (a/b) of the outer diameter (a) in the radial direction of the silicon single crystal of the ring which consists of an OSF-generating region, and the diameter (b) of a silicon single crystal was investigated as follows.

That is, after performing a heat treatment of heating at 1100° C. in an oxidizing atmosphere for 16 hours, 2-μm light etching (chromic acid etching) was performed, and the position of the ring which consists of an OSF-generating region was determined and computed by observing with an optical microscope. The result is shown in Table 2.

Moreover, each of the LPD number of the silicon wafer of Experimental Examples 6 to 12 was investigated as follows.

That is, each of the LPD number in the silicon wafer surface was obtained using a laser-light-scattering type particle counter (model SFS6220: produced by KLA-Tencor Co., Ltd.). The result is shown in Table 2. It should be noted that the LPD number here means the number of COP with a size of 0.11 μm or more detected on the surface per one silicon wafer.

Moreover, the presence or absence of a hydrogen defect of the silicon wafer of Experimental Examples 6 to 12 was investigated as follows.

That is, it was observed using a defective evaluation apparatus (OPP (Optical Precipitate Profiler): produced by High Yield Technology Co., Ltd.) through an infrared interfering method. The result is shown in Table 2.

As shown in Table 2, in the silicon wafer of Experimental Examples 6 to 10, and 12, the ratio of (a/b) is not more than 0.77, whereas the ratio of (a/b) was over 0.77 in the silicon wafer of Experimental Example 11.

In addition, it was confirmed that there was no hydrogen defect and that the number of LPD was small, i.e. not more than 12, in each silicon wafer of Experimental Examples 8 to 10, and 12, which are Examples of the present invention, in which the hydrogen molecule partial pressure ranged from 40 to 400 Pa and the ratio (a/b) was not more than 0.77.

Moreover, in the silicon wafer of Experimental Example 11 which is a comparative example of the present invention in which the ratio (a/b) exceeds 0.77, although the hydrogen molecule partial pressure was the same as Experimental Example 10, a hydrogen defect occurred. Therefore, it became clear that a hydrogen defect can be prevented by setting the ratio (a/b) to be not more than 0.77. Furthermore, the number of LPD of Experimental Example 11 was greater than that of Experimental Example 10.

Moreover, in the silicon wafer of Experimental Examples 6 and 7 whose hydrogen molecule partial pressure was less than 40 Pa, there was no hydrogen defect, because the hydrogen molecule partial pressure was low, but each of the number of LPD in the silicon wafer of Experimental Examples 6 and 7 was greater than that of each of Experimental Examples 8 to 10, and 12.

EXPERIMENTAL EXAMPLES 13 TO 19

A silicon single crystal with a diameter of 300 mm was grown at a higher pulling rate than that at which the OSF region disappeared at the crystal central part, using the same apparatus for growing a silicon single crystal as in Experimental Examples 6 to 12, while supplying an inert gas to which hydrogen was added to the pulling furnace so as to obtain the hydrogen molecular partial pressure in Experimental Examples 13 to 19 shown in Table 3, and then the resultant silicon single crystal was sliced to obtain a silicon wafer.

TABLE 3

| Experimental Example | $H_2$ Partial pressure (Pa) | Position where the OSF-ring exists (Wafer diameter ratio) (a/b) | Number of Epi-defect (piece/wf) | | | |
|---|---|---|---|---|---|---|
| | | | Epi-thickness 0.3 μm | Epi-thickness 0.5 μm | Epi-thickness 2 μm | Epi-thickness 4 μm |
| 13 | No doping | 0.48 | 694 | 358 | 62 | 4 |
| 14 | 30 | 0.51 | 343 | 161 | 45 | 3 |
| 15 | 40 | 0.73 | 587 | 11 | 4 | 3 |
| 16 | 40 | 0.27 | 141 | 2 | 1 | 4 |
| 17 | 240 | 0.69 | 645 | 8 | 3 | 1 |
| 18 | 240 | 0.90 | 1145 | 29 | 18 | 17 |
| 19 | 400 | 0.55 | 493 | 7 | 2 | 2 |

Note:
"Epi" in Table 3 means "Epitaxial Layer"

With respect to the silicon wafer of Experimental Examples 13 to 19 thus obtained, the ratio (a/b) of the outer diameter (a) in the radial direction of the silicon single crystal of the ring which consists of an OSF-generating region, and the diameter (b) of a silicon single crystal was investigated by the same way as in Experimental Examples 6 to 12. The result is shown in Table 3.

Moreover, an eptaxial layer was formed at a precipitateing temperature of 1050° C. onto the surface of each wafer of Experimental Examples 13 to 19 using $SiHCl_3$ gas, and each time an epitaxial layer with a thickness shown in Table 3 was formed, the number of Epi-defects was investigated as follows.

That is, the number of the Epi-defects on the surface of the silicon wafer was obtained using a laser-light-scattering type particle counter (SP1(surfscan SP1): produced by KLA-Tencor Co., Ltd.). The result is shown in Table 3. It should be noted that the number of the Epi-defects here is the result of measuring the LPD with a size of not less than 0.09 μm detected on the surface of one silicon wafer.

As shown in Table 3, the ratio (a/b) in the silicon wafer of Experimental Examples 13 to 17, and 19 is not more than 0.77, whereas the ratio (a/b) in the silicon wafer of Experimental Example 18 was over 0.77.

In addition, it was confirmed that there was no epitaxial layer defect and that the number of the Epi-defects became small, i.e. not more than 12 pieces/wf, in each silicon wafer of Experimental Examples 15 to 17, and 19, which are Examples of the present invention, in which the hydrogen molecule partial pressure ranged from 40 to 400 Pa and the ratio (a/b) was not more than 0.77.

It should be noted that even in each of the silicon wafer of Experimental Examples 15 to 17, and 19, which are Examples of the present invention, the number of Epi-defects was very large at the stage where the epitaxial layer with a thickness of 0.3 μm was formed.

Moreover, in the silicon wafer of Experimental Example 18, which is a comparative example of the present invention in which the ratio (a/b) exceeds 0.77, as shown in Table 3, although the hydrogen molecular partial pressure was the same as Experimental Example 17, an epitaxial layer defect occurred. Since a hydrogen defect exists in these wafers before Epi-growing, these Epi-defects originate in the hydrogen defect. Therefore, it became clear that the Epi-defect resulting from the hydrogen defect can be prevented by setting the ratio (a/b) to be not more than 0.77. Furthermore, in Experimental Example 18, the number of Epi-defects was far greater than that of Experimental Example 17, and even if an epitaxial layer with a thickness of 4 μm was formed, the number of Epi-defects did not decrease to not more than 12 pieces/wf.

Moreover, in the silicon wafer of Experimental Examples 13 and 14 in which the hydrogen molecular pressure was less than 40 Pa, there were no epitaxial layer defects derived from the hydrogen defect, however, since the reduced number of Epi-defects due to the formation of the epitaxial layer was small, it was necessary to form an epitaxial layer with a thickness of not less than 4 μm in order to reduce the number of Epi-defects to be not more than 12 pieces/wf.

EXPERIMENTAL EXAMPLES 20 TO 26

A silicon single crystal with a diameter of 300 mm was grown at a higher pulling rate than that at which the OSF region disappeared at the crystal central part, using the same apparatus for growing a silicon single crystal as in Experimental Examples 6 to 12, while supplying an inert gas to which hydrogen was added to the pulling furnace so as to obtain the hydrogen molecular partial pressure in Experimental Examples 20 to 26 shown in Table 4, and then the resultant silicon single crystal was sliced to obtain a silicon wafer.

TABLE 4

| Experimental Example | $H_2$ Partial pressure (Pa) | Position where the OSF-ring exists (Wafer diameter ratio) (a/b) | Number of COP after grinding by 5 μm (pieces/wf) | Number of COP after grinding by 10 μm (pieces/wf) |
|---|---|---|---|---|
| 20 | No doping | 0.49 | 4 | 327 |
| 21 | 30 | 0.55 | 3 | 134 |
| 22 | 40 | 0.77 | 6 | 2 |
| 23 | 40 | 0.29 | 9 | 3 |
| 24 | 240 | 0.65 | 7 | 8 |
| 25 | 240 | 0.87 | 21 | 21 |
| 26 | 400 | 0.59 | 5 | 6 |

With respect to the silicon wafer of Experimental Examples 20 to 26 thus obtained, the ratio (a/b) of the outer diameter (a) in the radial direction of the silicon single crytal of the ring which consists of an OSF-generating region, and the diameter (b) of a silicon single crystal was investigated by the same way as in Experimental Examples 6 to 12. The result is shown in Table 4.

Moreover, after performing a heat treatment at 1200° C. for 1 hour in an argon atmosphere on the silicon wafers of Experimental Examples 20 to 26 thus obtained, each of the resultant silicon wafer was polished by the thickness shown in Table 4, thereby investigating the number of COP which did not disappear but remained during annealing as follows.

That is, the number of COP on the surface of the silicon wafer was obtained using a laser-light-scattering type particle counter (SP1(surfscan SP1): produced by KLA-Tencor Col, Ltd.). The result is shown in Table 4. It should be noted that the COP number here means the number of COP traces with a size of not less than 0.09 μm detected on the surface of one silicon wafer. The result is shown in Table 4.

As shown in Table 4, in the silicon wafer of Experimental Examples 20 to 24, and 26, the ratio (a/b) was not more than 0.77, and the ratio(a/b) was over 0.77 in the silicon wafer of Experimental Example 25.

In addition, it was confirmed that, as shown in Table 4, the number of COP of the silicon wafer polished by 5 μm and the number of COP of the silicon wafer polished by 10 μm decreased to not more than 12 pieces/wf, in each silicon wafer of Experimental Examples 22 to 24, and 26, which are Examples of the present invention, in which the hydrogen molecule partial pressure ranged from 40 to 400 Pa and the ratio (a/b) was not more than 0.77.

Moreover, as shown in Table 4, it became clear that in the silicon wafer of Experimental Example 25, which is a comparative example of the present invention in which the ratio (a/b) exceeds 0.77, although the hydrogen molecular partial pressure is the same as that of Experimental Example 24, the number of COP of the silicon wafer polished by 5 μm and the number of COP of the silicon wafer polished by 10 μm were over 12 pieces/wf, and that the hydrogen defect did not disappear even after being subjected to a heat-treatment existed.

Moreover, among the silicon wafers having a hydrogen molecular partial pressure of less than 40 Pa in Experimental Examples 20 and 21, the silicon wafer which was polished by 5 μm had a small number of COP, i.e. not more than 12 pieces/wf, whereas the silicon wafer which was polished by 10 μm had a very large number of COP.

From this result, it could be confirmed that it was possible to form a DZ layer (defect-free layer) in Experimental Examples 22 to 24 and 26, which are Examples of the present invention, which was deeper than that of Experimental Examples 20 and 21, in the case of the same heat treatment.

EXPERIMENTAL EXAMPLES 27 TO 33

A silicon single crystal with a diameter of 300 mm was grown at a higher pulling rate than what at which the OSF region disappeared at the crystal central part, using the same apparatus for growing a silicon single crystal as in Experimental Examples 6 to 12, while supplying an inert gas to which hydrogen was added to the pulling furnace so as to obtain the hydrogen molecular partial pressure in Experimental Examples 27 to 33 shown in Table 5, and then the resultant silicon single crystal was sliced to obtain a silicon wafer.

TABLE 5

| Experimental Example | H₂ Partial pressure (Pa) | Position where the OSF-ring exists (Wafer diameter ratio) (a/b) | Number of COP after grinding by 5 μm (pieces/wf) | Number of COP after grinding by 10 μm (pieces/wf) |
| --- | --- | --- | --- | --- |
| 27 | No doping | 0.49 | 236 | 645 |
| 28 | 30 | 0.55 | 197 | 332 |
| 29 | 40 | 0.77 | 5 | 13 |
| 30 | 40 | 0.29 | 5 | 9 |
| 31 | 240 | 0.65 | 5 | 4 |
| 32 | 240 | 0.87 | 19 | 19 |
| 33 | 400 | 0.59 | 7 | 3 |

With respect to the silicon wafer of Experimental Examples 27 to 33 thus obtained, the ratio (a/b) of the outer diameter (a) in the radial direction of the silicon single crystal of the ring which consisted of an OSF-generating region, and the diameter (b) of a silicon single crystal was investigated by the same way as in Experimental Examples 6 to 12. The result is shown in Table 4.

Moreover, after performing a heat treatment at 1125° C. for 2 hours in an argon atmosphere on the silicon wafers of Experimental Examples 27 to 33 thus obtained, each of the resultant silicon wafer was polished by the thickness shown in Table 5, thereby investigating the number of COP by the same way as in Experimental Examples 20 to 26. The result is shown in Table 5.

As shown in Table 5, the ratio (a/b) was not more than 0.77 in the silicon wafer of Experimental Examples 27 to 31, and 33 and the example 33 of an experiment, whereas the ratio (a/b) was over 0.77 in the silicon wafer of Experimental Example 32.

In addition, it was confirmed that, as shown in Table 5, the number of COP of the silicon wafer which was polished by 5 μm and the number of COP of the silicon wafer which was polished by 10 μm decreased to not more than 12 pieces/wf, in each silicon wafer of Experimental Examples 29 to 31, and 33, which are Examples of the present invention, in which hydrogen molecule partial pressure ranged from 40 to 400 Pa and the ratio (a/b) was not more than 0.77.

Moreover, as shown in Table 4, it became clear that in the silicon wafer of Experimental Example 32, which is a comparative example of the present invention in which the ratio (a/b) exceeds 0.77, although the hydrogen molecular partial pressure was the same as that of Experimental Example 31, the number of COP of the silicon wafer which was polished by 5 μm and the number of COP of the silicon wafer which was polished by 10 μm were over 12 pieces/wf, and that the hydrogen defect did not disappear and existed even after being subjected to a heat-treatment.

Moreover, in Experimental Examples 27 and 28 in which the hydrogen molecular partial pressure was less than 40 Pa, the number of COP in each silicon wafer which was polished by 5 μm and which was polished by 10 μm was very large, and effect of eliminating the COP by heat treatment could not be sufficiently obtained.

From this result, it could be confirmed that it was possible to form a defect-free layer in Experimental Examples 29 to 31, and 33, which are Example of the present invention, even if the heat treatment was performed at a temperature which was lower than that of Experimental Examples 27 and 28.

EXPERIMENTAL EXAMPLES 34 TO 35

A silicon single crystal with a diameter of 300 mm was grown at a higher pulling rate than that at which the OSF region disappeared at the crystal central part, using the same apparatus for growing a silicon single crystal as in Experimental Examples 6 to 12, while supplying an inert gas to which hydrogen was added to the pulling furnace so as to obtain the hydrogen molecular partial pressure in Experimental Examples 34 to 35 shown in Table 6, and then the resultant silicon single crystal was sliced to obtain a silicon wafer.

TABLE 6

| Experimental Example | H₂ Partial pressure (Pa) | Position where the OSF-ring exists (Wafer diameter ratio) (a/b) | Number of COP after grinding by 5 μm (pieces/wf) | Number of COP after grinding by 10 μm (pieces/wf) |
| --- | --- | --- | --- | --- |
| 34 | 240 | 0.65 | 451 | 2189 |
| 35 | 400 | 0.59 | 692 | 3345 |

With respect to the silicon wafer of Experimental Examples 34 to 35 thus obtained, the ratio (a/b) of the outer diameter (a) in the radial direction of the silicon single crystal of the ring which consisted of an OSF-generating region, and the diameter (b) of a silicon single crystal was investigated by the same way as in Experimental Examples 6 to 12. The result is shown in Table 6.

Moreover, after performing a heat treatment at 1075° C. for 4 hours in an argon atmosphere on the silicon wafer of Experimental Examples 34 to 35 thus obtained, each of the resultant silicon wafers was polished by the thickness shown in Table 6, thereby investigating the number of COP by the same way as in Experimental Examples 20 to 26. The result is shown in Table 6.

As shown in Table 6, in the silicon wafer Experimental Examples 34 and 35, the ratio (a/b) was not more than 0.77.

In the silicon wafer of Experimental Example 34, as shown in Table 6, the number of COP was very large in the silicon wafer which was polished by 5 μm and the silicon wafer which was polished by 10 μm, and the eliminating effect of the COP by heat treatment could not be sufficiently obtained.

EFFECT OF THE INVENTION

In accordance with the present invention, a process for growing a silicon single crystal which is capable of growing a silicon single crystal at a pulling rate which is not lower than the critical pulling rate at which an OSF-generating region will be generated even if an atmospheric gas for growing a single crystal contains a gaseous hydrogen-containing substance, and of growing a silicon single crystal which contains an OSF-generating region and no hydrogen defects is provided.

As mentioned above, although a preferable operation of the present invention was explained, the present invention is not limited to these, and addition of composition, abbreviation, substitution, and other changes are possible as long as within the scope of the present invention. The present invention is not limited by the explanation mentioned above and is limited by only the range of an attached claim.

What is claimed is:

1. A process for growing a silicon single crystal by the Czochralski method characterized by using an atmospheric gas for growing a single crystal which is a hydrogen-containing gas which contains a hydrogen-containing substance, and pulling said silicon single crystal at a pulling rate ranging from a value with which a ratio (a/b) of a diameter (b) of said silicon single crystal and an outer diameter (a) of a ring which consists of an OSF-generating region in the radial direction of said silicon single crystal is not higher than 0.77 to another value with which said OSF-generating region disappears at the center part of the crystal.

2. The process for growing a silicon single crystal as set forth in claim 1, wherein said hydrogen-containing substance in said hydrogen-containing gas has a concentration ranging from 40 to 400 Pa in terms of hydrogen gas reduced partial pressure.

3. The process for growing a silicon single crystal as set forth in claim 1, wherein said silicon single crystal is grown using a hot-zone structure in which a temperature gradient (Gc) at the center part of crystal is equivalent to or higher than (Gc≧Ge) a temperature gradient (Ge) at the circumferential part of the crystal.

4. The process for growing a silicon single crystal as set forth in any one of claims 1 to 3, wherein said hydrogen-containing substance is hydrogen gas.

5. The process for growing a silicon single crystal as set forth in any one of claims 1 to 3, wherein said oxygen concentration is not more than $12 \times 10^{17}$ atoms/cm$^3$ (ASTM F121-1979).

6. The process for growing a silicon single crystal as set forth in any one of claims 1 to 3, wherein said silicon single crystal which is pulled up has a defect-free region outside said ring.

7. A process for producing a silicon wafer characterized by performing a defect-free layer-forming heat treatment on a silicon wafer extracted from a straight trunk part of a silicon single crystal which is grown by the process for growing a silicon single crystal as set forth in any one of claims 1 to 3.

8. The process for producing a silicon wafer characterized by growing an epitaxial layer onto the surface of the silicon wafer extracted from a straight trunk part of a silicon single crystal which is grown by the process for growing a silicon single crystal as set forth in any one of claims 1 to 3.

* * * * *